United States Patent [19]

Lee et al.

[11] Patent Number: 5,672,905
[45] Date of Patent: Sep. 30, 1997

[54] SEMICONDUCTOR FUSE AND METHOD

[75] Inventors: Steven S. Lee; Gayle W. Miller, both of Colorado Springs, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 935,306

[22] Filed: Aug. 26, 1992

[51] Int. Cl.⁶ .................................................. H01L 29/00
[52] U.S. Cl. ........................................ 257/529; 257/665
[58] Field of Search ........................... 257/529, 50, 665

[56] References Cited

U.S. PATENT DOCUMENTS

| | | |
|---|---|---|
| 4,045,310 | 8/1977 | Jones et al. . |
| 4,064,493 | 12/1977 | Davis .................................... 365/96 |
| 4,198,744 | 4/1980 | Nicolay ................................ 257/665 |
| 4,312,046 | 1/1982 | Taylor . |
| 4,424,578 | 1/1984 | Miyamoto . |
| 4,441,167 | 4/1984 | Principi ................................ 365/94 |
| 4,590,589 | 5/1986 | Gerzberg ............................ 365/100 |
| 4,647,340 | 3/1987 | Szluk et al. . |
| 4,692,787 | 9/1987 | Possley et al. ..................... 357/59 |
| 5,017,510 | 5/1991 | Welch et al. ....................... 437/192 |
| 5,120,679 | 6/1992 | Boardman et al. ................ 437/195 |
| 5,241,212 | 8/1993 | Motonami et al. ................. 257/529 |
| 5,244,836 | 9/1993 | Lim ...................................... 437/192 |
| 5,258,643 | 11/1993 | Cohen ................................ 257/530 |

FOREIGN PATENT DOCUMENTS

| | | | |
|---|---|---|---|
| 241046 | 10/1987 | European Pat. Off. . | |
| 56-085846 | 7/1981 | Japan ................................ | 257/529 |
| 3-124047 | 5/1991 | Japan ................................ | 257/529 |
| 986198 | 3/1985 | U.S.S.R. . | |
| 02005078 | 4/1979 | United Kingdom ............. | 257/529 |
| 9304499 | 3/1993 | WIPO ............................... | 257/665 |

*Primary Examiner*—Mahshid D. Saadat
*Assistant Examiner*—T. M. Arroyo
*Attorney, Agent, or Firm*—William W. Cochran, II; Wayne P. Bailey; Douglas S. Foote

[57] ABSTRACT

A semiconductor fuse and method for fabricating the same An insulating layer is provided and a trench formed therein. A fusible link is then formed across the insulating layer and trench and conformal therewith. The link has a break region of minimum thickness and width at an intersection of a sidewall and bottom surface of the trench.

8 Claims, 2 Drawing Sheets

5,672,905

SEMICONDUCTOR FUSE AND METHOD

The present invention relates to a programmable read only memory (PROM). More particularly, it relates to a semiconductor fuse for a PROM and a method for fabricating the fuse.

CROSS REFERENCE TO RELATED APPLICATION

This application is related to application Ser. No. 07/935,301, entitled "Semiconductor Fuse with Polysilicon Plate and Method of Fabrication" by Steven S. Lee and Gayle W. Miller filed at the same time as the present application.

BACKGROUND OF THE INVENTION

Computers typically have a number of different types of data storage or memory devices. For example, a read only memory (ROM) is a semiconductor memory device in which data is permanently stored. The data cannot be overwritten or otherwise altered by the user. A ROM is also non-volatile which means that the data is not destroyed when power is lost. A ROM is "programmed" during its manufacture by making permanent electrical connections in selected memory cells. ROMs are useful wherever unalterable data or instructions are required. A disadvantage of ROMs is that their programming is determined during the design stage and can only be varied by redesigning the chip.

An alternative to a ROM is a programmable read only memory (PROM) which is programmable once after its manufacture. In one type of PROM, each memory cell is provided with an electrical connection in the form of a fusible link (fuse). There are a considerable number of known designs for fuses used in PROMs. Perhaps the most common is a metal link, such as tungsten, which is narrowed or necked down in one region. To blow the fuse, a relatively high current is driven through the link. The current heats the link to its melting point and the link is broken. Usually, the link breaks in the necked down region because that is where the current density is highest.

Computer chips typically have two or more metal layers often referred to as metal 1, metal 2, etc. The lower the metal number, the closer it is to the chip substrate. Thus, metal 1 is closer to the chip substrate than is metal 2, and metal 2. Metal 1 is typically used for signal transmission and metal 2 for power supply lines. Consequently, in many designs the fuse is laid out in the first metal layer. Such designs have several problems. For example, when the relatively high current required to blow a fuse is generated, higher level layers can be damaged. To overcome this problem, chips are sometimes designed so that there is only a single metal layer in the fuse regions. Such design practices reduce the density of components on the chip.

Another problem with existing fuse designs is referred to as "growback" or "metal migration". Growback is a phenomenon in which a fuse metal which has been blown grows back together to reconnect the fusible link. Although the physics of growback is not completely understood, if the link reconnects, data is altered—clearly an undesirable result.

A further problem with existing fuse designs is that they are unsatisfactory for smaller geometry devices. For example, U.S. Pat. No. 4,045,310 discloses a method for fabricating a fuse which involves accurate alignment and carefully controlled etching times. The precision required for these steps would make its use in very small geometry devices difficult if not impossible.

OBJECTS OF THE INVENTION

It is therefore an object of the present invention to provide a new and improved semiconductor fuse and method for fabricating the same.

It is another object of the present invention to provide a method for fabricating a semiconductor fuse which is precise enough to be used on very small geometry devices.

It is a further object of the present invention to provide a fuse that can be used in a high density, small geometry semiconductor chip.

It is yet another object of the present invention to provide a semiconductor fuse which is resistant to "grow back".

It is yet a further object of the present invention to provide a semiconductor fuse which can be fabricated in any metal layer of a chip.

SUMMARY OF THE INVENTION

One form of the present invention is a method for fabricating a semiconductor. An insulating layer is provided and a trench is formed therein. A fusible link is then formed across the insulating layer and trench and conformal therewith. The link has a break region of minimum thickness and width at an intersection of a sidewall and bottom surface of the trench.

Another form of the present invention is a fusible metal link in a semiconductor. The link has a thickness profile resulting from the deposition of metal onto an insulator and onto sidewalls and bottom of a trench formed therein.

In yet another form, the fusible metal link has a break region formed by the sharp intersection of two convex outer surfaces of the link.

In still another form, the break region covers the intersection of two generally flat surfaces inside a trench and has a minimum thickness.

DESCRIPTION OF A PREFERRED EMBODIMENT

Figure 1:
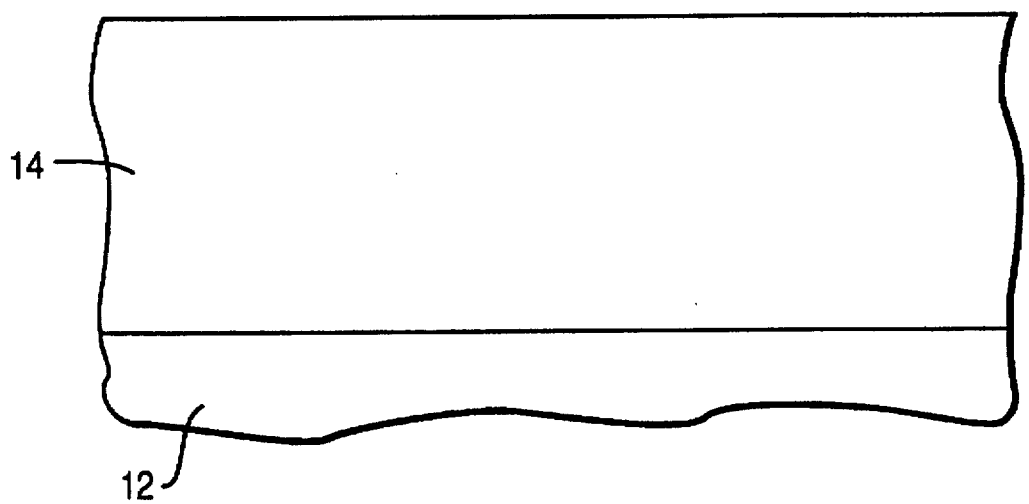
FIGS. 1–3 are sequentially selected cross sectional views, at various stages of the fabrication of a semiconductor fusible link according to one form of the present invention.
Figure 2:
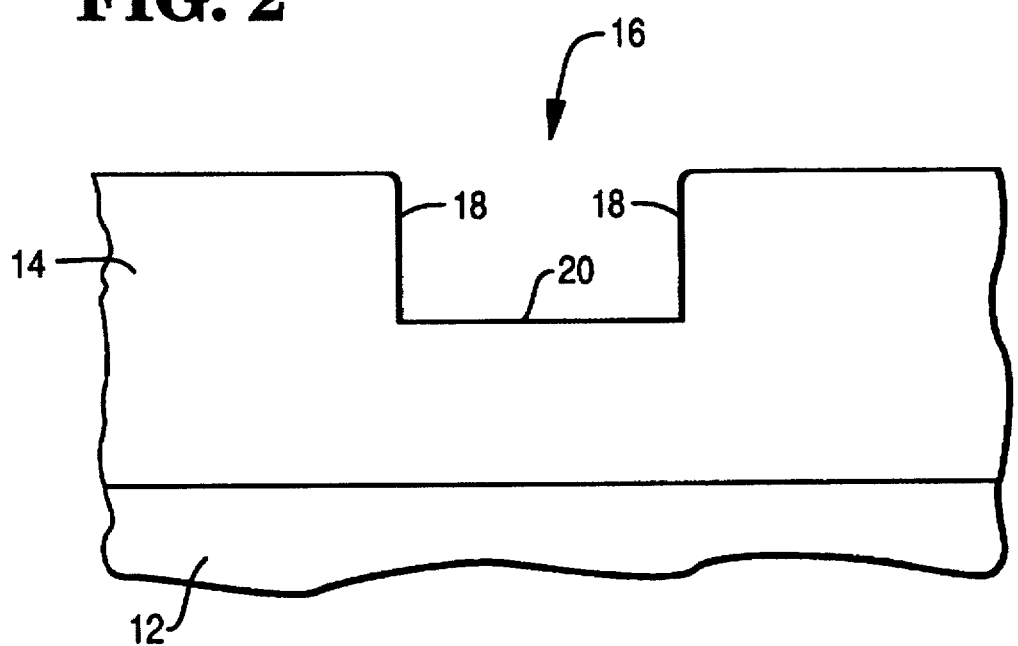
Figure 3:
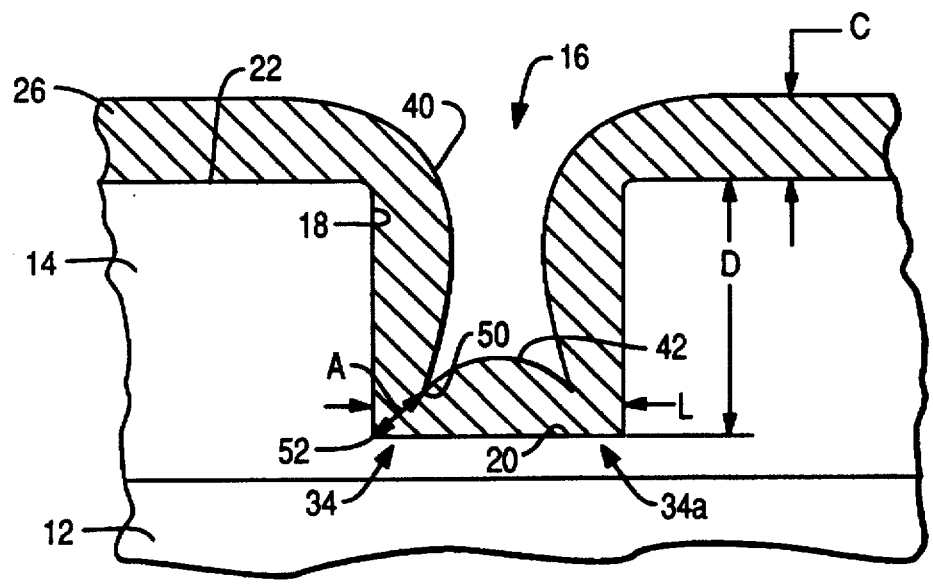

FIGS. 1–3 show selected views of a semiconductor device during the fabrication of a fusible link. As shown in FIG. 1, an insulating layer 14 is formed on top of an underlying layer 12. In one form of the invention, layer 12 may be a silicon substrate. In another form, layer 12 is a metal layer such as metal 1. Insulating layer 14 may be provided in many different ways: For example, if layer 12 silicon, insulating layer 14 may be a thermally grown $SiO_2$ Alternatively, layer 14 can be deposited or applied as a spin-on-glass, such as a boron phosphorous silica glass. It is also possible to form insulating layer 14 by forming multiple insulating layers using one or more of the above processes.

Layer 14 may be covered with photoresist which is then patterned and etched to form a trench 16 in insulating layer 14. Trench 16 has a number of flat surfaces. These surfaces intersect at relatively sharp edges. For a 90 degree angle, the maximum radius of the angle/formed by these surfaces is about 0.2 micrometers. In a preferred embodiment shown in FIG. 2, trench 16 has a flat bottom surface 20 and essentially vertical sidewalls 18. Thus, the intersection of a sidewall 18 and bottom surface 20 forms a right angle. However, the invention is not limited to this specific configuration. Other configurations for trench 20 are possible—as long as the angle between the trench surfaces is relatively sharp and the angle of intersection is less than about 120 degrees.

In FIG. 3, a fusible link 26 has been formed across insulating layer 14 and trench 16. Link 26 is formed by first depositing a layer of link material over the exposed surface of insulating layer 14 and trench 16. The link material is preferably a metal, and more specifically aluminum which is deposited by sputtering. The aluminum is deposited conformally with layer 14 and the surfaces defining trench 16. In this context, "conformally" means that the aluminum generally conforms to the upper surface of insulating layer 14, sidewalls 18 of trench 16 and the bottom surface 20 of trench 16. However, "conformally" does not mean that the outer surface of the aluminum is exactly geometrically similar to the surface on which it is deposited. The degree to which the material is not similar is influenced by the dimensions of trench 16, as will be described below.

Figure 4:
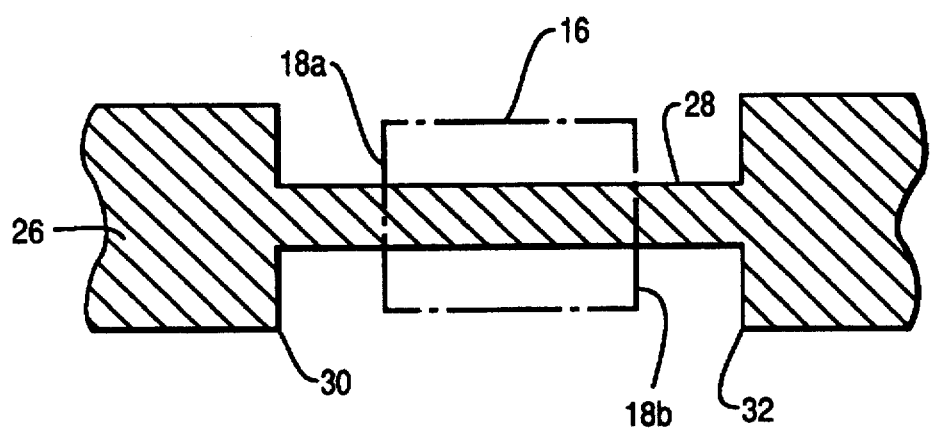
FIG. 4 is a top view of the fuse in FIG. 3. Selected hidden lines are shown in phantom.

After depositing the aluminum, photoresist is applied and the aluminum is patterned into a conductive line by selective etching. The selective etch of the aluminum defines the width of link 26. FIG. 4 shows a top view of the resulting link 26. Link 26 has a narrowed or necked down region 28 which has a minimum width, i.e., a smaller width than the rest of fusible link 26. Necked down region 28 is bounded by transition regions 30 and 32. Each region 30 and 32 marks the transition between the wider portion of fusible link 26 and necked down region 28. In the FIG. 4 embodiment, necked down region 28 overlies trench 16.

Referring again to. FIG. 3, it can be seen that fusible link 26 has a generally uniform thickness except in a break region 34. What is meant by "break region" is a region where the fuse is most likely to break when subject to a programming or fuse blowing current. When metal is deposited over insulator 14 and trench 16, a shadowing effect (described more fully below) occurs, resulting in the thickness profile of link 26 as shown. This profile includes the two convex outer surfaces 40 and 42 of link 26. Convex surface 40 is formed along sidewall 18 and convex surface 42 is formed along bottom surface 20 of trench 16. Break region-34 is formed by the sharp intersection 50 of convex surfaces 40 and 42 which is at the intersection 52 of sidewall 18 and bottom surface 20 of trench 16. Intersection 50 is essentially closer to intersection 52 than any other point on the outer surface of link 26.

As noted above, the thinning of link 26 in region 34 is caused by the shadowing effect when depositing material in a small geometry trench. The "shadowing effect" occurs during the deposition process because the sputtered flux is not completely perpendicular to the substrate. When the substrate includes a trench, the top corners of the trench receive more flux than the bottom corners of the trench. Thus, the bottom of the trench is said to be shadowed in much the same way as it would were non-perpendicular light beams lighting the substrate from above. FIG. 3 shows a characteristic shadowing profile of a deposited link material.

Preferably, trench 16 has a small length (L) and a somewhat larger depth (D). The ratio of depth to length is referred to as the aspect ratio. Preferably, D/L>1. The larger the aspect ratio, the greater the shadowing effect caused by the deposition.

The thickness "A" at break region 34 is significantly less than the thickness "C" of the rest of link 26. In fact, if D/L>1, A/C<0.3. The minimum thickness of link 26 occurs in break region 34. Break region 34 also falls within necked down region 28 of link 26 where the width of link 26 is also a minimum. Thus, the cross sectional area of link 26 is a minimum at break region 34. It will be appreciated, that on the opposite side of trench 16 there is another break region 34a which has roughly the same minimum cross sectional area as break region 34.

As used herein, the "width" of a metal line is normal to both the direction of current flow and to the thickness of the metal line. Similarly, the cross sectional area of a metal line such as link 26 is the area through which current can flow. For a rectangular metal line, the cross sectional area at a point along its length is the product of the width and thickness of the line at that point.

In operation, if fusible link 26 is to be "blown", a programming current in excess of the normal operating current is passed through link 26. Current passing therethrough, heats link 26. Since the minimum cross sectional area occurs in break region 34, the current density and hence the heating will be its greatest in break region 34. Thus, when subject to a programming current, break region 34 gets hotter than the rest of link 26. When the temperature is sufficiently high, link 26 melts. This design allows the temperature of in the break region to be high enough to provide a clean break during the melt which results in a reduced chance for the fuse to grow back.

Figure 5:
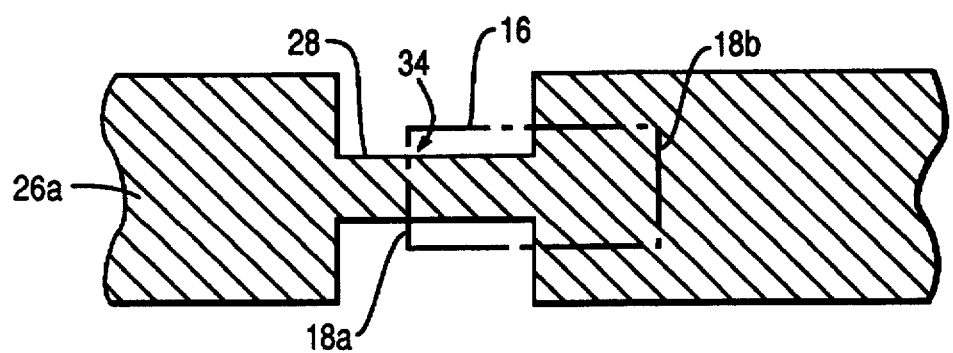
FIG. 5 is a a top view of a semiconductor fuse according to another form of the present invention. Selected hidden lines are shown in phantom.

FIG. 5 is a top view of fuse 10 according to an alternative embodiment of the present invention. As with the FIG. 4 embodiment, metal link 26a extends across trench 16 so that it covers sidewalls at ends 18a and 18b. However, unlike the FIG. 4 embodiment in which there are break regions at opposite ends 18a and 18b of trench 16, in the FIG. 5 embodiment only a single sidewall 18a is covered by necked down region 28. Thus, link 26 has a break region 34 only at one end of trench 16. The advantage of the FIG. 5 embodiment is that it is a higher density configuration; thus, less area is required.

It will be clear to those skilled in the art that the present invention is not limited to the specific embodiment disclosed and illustrated herein. It will be understood that the dimensions and proportional relationships shown in the drawings are illustrated by way of example only and these illustrations are not to be taken as the actual dimensions or proportional relationships used in the present invention.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A method for fabricating a semiconductor fuse, comprising:

providing an insulating layer;

forming, in said insulating layer, a trench having a depth that is greater than its length, and having sidewalls and a bottom surface; and forming a fusible link across said layer and trench and conformal therewith, said link having a break region of minimum thickness and width at an intersection of said sidewall and said bottom surface.

2. The method of claim 1 wherein said fusible link is formed by depositing metal over said insulating layer and trench.

3. The method of claim 2 wherein selected regions of said deposited metal are etched to define the width of said link.

4. The method of claim 3 wherein said metal is aluminum.

5. The method of claim 4 wherein said aluminum is deposited by sputtering.

6. In a semiconductor, a fusible aluminum link having a break region, said break region covering the intersection of two flat surfaces inside a trench, and the thickness of said break region is less than the thickness of the remainder of said link, wherein said link has a necked down region having a width which is less than the width of the rest of the link, said break region is included in said necked down region, and said necked down region extends across said trench so that it covers a sidewall only at a first end of said trench.

7. The fusible link of claim 6 wherein said link has a break region only at said first end.

8. In a semiconductor, a fusible metal link, said link having a thickness profile resulting from the deposition of metal onto an insulator and onto sidewalls and bottom of a trench formed therein, the trench having a depth greater than its length.

* * * * *